US009552051B2

(12) United States Patent
Elias et al.

(10) Patent No.: US 9,552,051 B2
(45) Date of Patent: Jan. 24, 2017

(54) BLOCK PARTITION TO MINIMIZE POWER LEAKAGE

(71) Applicant: Intel Corporation, Santa Clara, CA (US)

(72) Inventors: Vinu K. Elias, Austin, TX (US); Sridharan Ranganathan, San Ramon, CA (US); Paul S. Durley, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 167 days.

(21) Appl. No.: 14/278,566

(22) Filed: May 15, 2014

(65) Prior Publication Data

US 2015/0333735 A1 Nov. 19, 2015

(51) Int. Cl.
*G06F 1/32* (2006.01)
*H03K 3/01* (2006.01)

(52) U.S. Cl.
CPC ........... *G06F 1/3287* (2013.01); *G06F 1/3253* (2013.01); *H03K 3/01* (2013.01)

(58) Field of Classification Search
CPC ................................ G06F 1/32; G06F 1/3203
USPC ......................................................... 713/320
See application file for complete search history.

(56) References Cited

U.S. PATENT DOCUMENTS

| 8,255,708 | B1* | 8/2012 | Zhang | G06F 1/3206 713/300 |
| 8,850,252 | B2* | 9/2014 | Doshi | G06F 13/385 710/10 |
| 8,924,598 | B1* | 12/2014 | Castleberry | G06F 13/385 710/14 |
| 2006/0076977 | A1* | 4/2006 | Zhu | G06F 13/4081 326/86 |
| 2009/0204837 | A1* | 8/2009 | Raval | G06F 1/3203 713/330 |
| 2014/0047257 | A1* | 2/2014 | Masson | G06F 1/3253 713/324 |

* cited by examiner

*Primary Examiner* — Chun Cao
(74) *Attorney, Agent, or Firm* — International IP Law Group, P.L.L.C.

(57) ABSTRACT

Disclosed herein is a system to minimize power leakage. The system is configured to include a system-on-chip (SOC). The SOC is configured to include a Universal Serial Bus (USB) physical subsystem and system firmware, wherein the system firmware conveys USB related events to the SOC. The system is configured to include a power management apparatus, where the power management apparatus includes USB wake functionality and USB On-the-Go (OTG) functionality.

31 Claims, 8 Drawing Sheets

600

BLOCK PARTITION TO MINIMIZE POWER LEAKAGE

TECHNICAL FIELD

The present disclosure is generally related to minimizing power leakage from electronic systems. More specifically, the present disclosure relates to techniques for minimizing Input/Output (I/O) power leakage from electrical systems and devices.

BACKGROUND

A system on chip (SOC) integrates multiple functions on an integrated circuit of a device, thereby providing higher performance, lower memory requirements, higher system reliability, and lower consumer costs. However, one key design constraint for an SOC is its tendency to dissipate large amounts of power. Specifically, input/output (I/O) power leakage from a device, including an SOC, is a form of power dissipation that affects the battery life of the device during standby modes.

In some cases, the SOC may include a Universal Serial Bus (USB) subsystem. The USB subsystem may also include a physical layer (PHY) that requires a high voltage rail (e.g., 3.3 V) and a continuous power-ON status, even in a stand-by mode, in order to detect any USB port state change events, e.g., the attachment or detachment of a USB cable. This combination of a high-pad voltage and a continuous power-ON requirement on the USB PHY subsystem lends to one of the highest I/O power leakage contributors on the SOC.

BRIEF DESCRIPTION OF THE DRAWINGS

The following detailed description may be better understood by referencing the accompanying drawings, which contain specific examples of numerous objects and features of the disclosed subject matter.

The same numbers are used throughout the disclosure and the figures to reference like components and features. Numbers in the 100 series refer to features originally found in FIG. 1; numbers in the 200 series refer to features originally found in FIG. 2; and so on.

DETAILED DESCRIPTION

Figure 1:
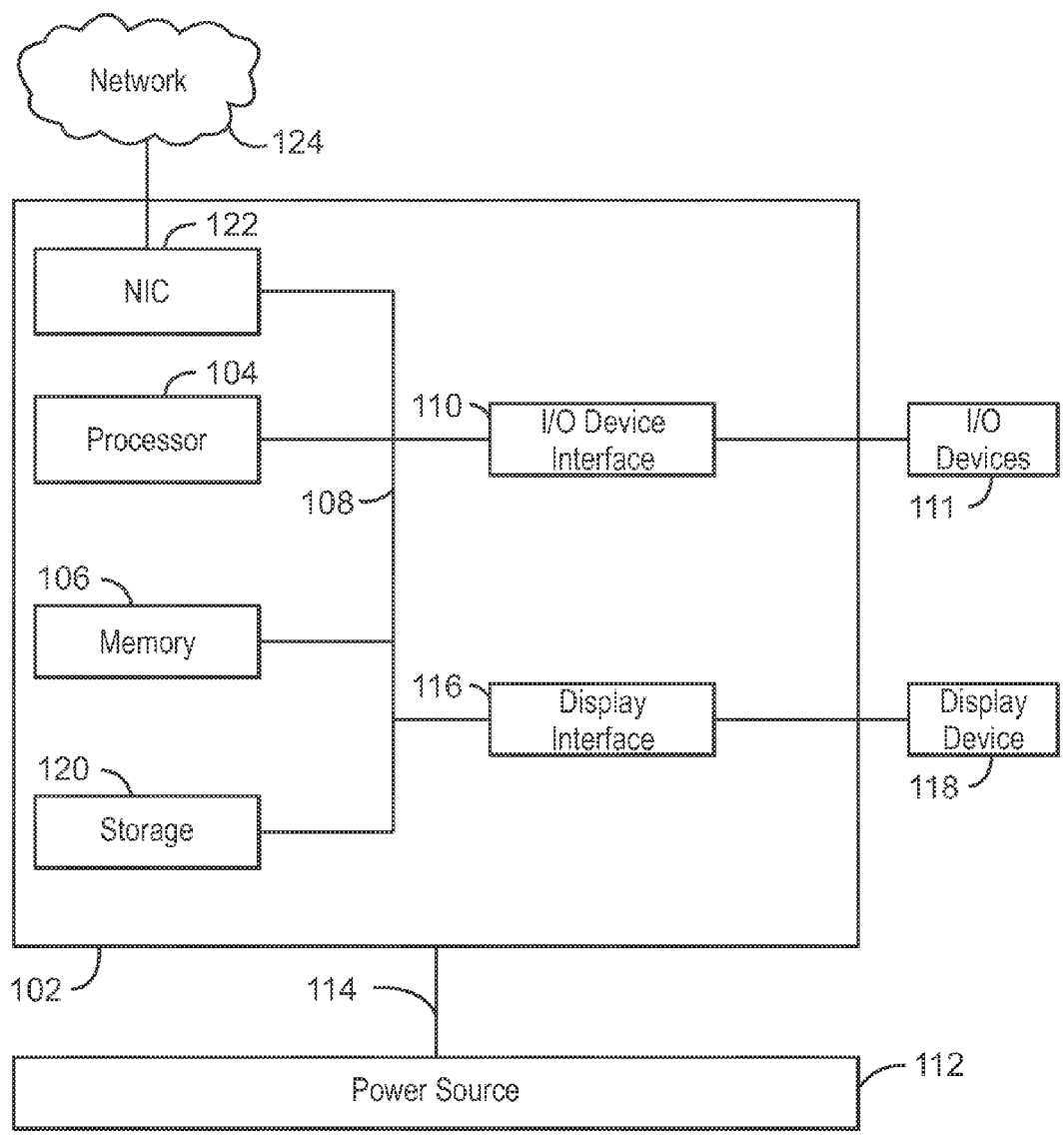
FIG. 1 is a block diagram of an example of an electronic computing system.

Low power management is a critical design challenge for many of the systems on chips (SOCs) on the market today. Designers for SOCs are often faced with the challenge of creating complex SOCs with increased amounts of functionality, while maintaining or decreasing power consumption. As discussed above, one component on an SOC that may contribute to increased amounts of power dissipation includes the Universal Serial Bus (USB) PHY subsystem. The USB PHY subsystem is present on most SOCs today, and usually includes ports of choice for battery charging and device synchronizing with a host portable computer (PC) or other devices. However, USB 2.0 specification requirements for the USB PHY subsystem usually require a high voltage (V), e.g., 3.3 volts (V). Additionally, high-voltage analog blocks associated with the USB PHY subsystem must remain in a power-ON position during sleep or stand-by modes in order to detect any USB related state changes, e.g., USB cable attachment or detachment. As a result, these high-voltage analog blocks are a leading contributor to high power leakage on the SOC.

Embodiments described herein disclose a system and method for power-gating rails to a USB PHY subsystem on an SOC. The system and method for power-gating may include partitioning and relocating high-voltage functionality, including USB wake functionality and on-the-go (OTG) functionality, from an SOC to a power management apparatus. The high-voltage functionality may include high-voltage analog blocks utilized to detect any USB related events, such as USB port state changes related to the attachment and detachment of a USB cable. The power management apparatus can include high-voltage islands that maintain a power-ON status independent of the SOC. Collectively, the high voltage islands of the power management apparatus can accommodate different high-voltage analog blocks running at various voltage levels. In order to relay the USB related events to the SOC, firmware may be implemented on the SOC. By power-gating the rails to the USB PHY subsystem, power to the USB PHY subsystem may be completely shut down during sleep or standby modes. This may enable the SOC to enter into deep power states for longer periods of time in an effort to lower power dissipation and leakage. Although the present techniques are described using a power management apparatus, any power management techniques can be used. For example, the power management apparatus may be a power management chip. Further, power management logic may be used in accordance with the present techniques.

In the following description, numerous specific details are set forth, such as examples of specific types of processors and system configurations, specific hardware structures, specific architectural and micro architectural details, specific register configurations, specific analog blocs, specific system components, specific system functionalities, etc. in order to provide a thorough understanding of the present disclosure. It will be apparent, however, to one skilled in the art that these specific details need not be employed to practice the present disclosure. In other instances, well known components or methods, such as specific and alternative processor architectures, specific logic circuits/code for described algorithms, specific firmware code, specific interconnect operations, specific logic configurations, specific manufacturing techniques and materials, specific power down and gating techniques/logic and other specific operational details of computer system have not been described in detail in order to avoid unnecessarily obscuring the present disclosure.

Although the following embodiments may be described with reference to energy conservation and energy efficiency in specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from better energy efficiency and energy conservation.

Moreover, the system, the method, and the device described herein are not limited to physical computing devices, but may also relate to software optimizations for energy conservation and efficiency. As will become readily apparent in the description below, the embodiments of the system, the method, and the device described herein (whether in reference to hardware, firmware, software, or a combination thereof) are vital to eliminating and reducing leakage power from a system-on-chip (SOC).

FIG. 1 is a block diagram of an example of an electronic computing system 100. The electronic computing system 100 may include an integrated circuit (IC), such as a system-on-chip (SOC) 102, where all components of the electronic computing system 100 are integrated onto a single chip. The SOC 102 can include hardware components, including digital analog, mixed-signal, and radio-frequency functions, and software components. The SOC 102 may be a host computing device, for example, a laptop computer, desktop computer, tablet computer, mobile device, server, or cellular phone, among others. The SOC 102 may include a main processor 104 that is adapted to execute stored instructions, as well as a memory device 106 that stores instructions that are executable by the main processor 104. The main processor 104 can be a single core processor, a multi-core processor, a computing cluster, or any number of other configurations. In some embodiments, the main processor 104 includes dual-core processor(s), dual-core mobile processor(s), or the like. The memory device 106 can include random access memory (e.g., SRAM, DRAM, zero capacitor RAM, SONOS, eDRAM, EDO RAM, DDR RAM, RRAM, PRAM, etc.), read only memory (e.g., Mask ROM, PROM, EPROM, EEPROM, etc.), flash memory, or any other suitable memory systems.

The main processor 104 can be connected through a system bus 108 (e.g., PCI, ISA, PCI-Express, etc.) to an I/O device interface 110. In one or more embodiments, the I/O device interface 110 may be coupled with one or more I/O devices 111. The I/O devices 111 may be USB devices. In some aspects, the I/O device interface 110 includes a USB PHY subsystem that provides a connection between digital and modulated parts of the USB interface.

The SOC 102 may be adapted to connect to a power source 112, such as a power management logic/apparatus. The power source 112 may be utilized for managing the power requirements of the electronic computing system 100. The SOC 102 and the power source 112 may also be connected via an interface 114. In particular, the power source 112 may be controlled and programmed via the interface 114, including an I²C data path interface, which may operate in conjunction with the SOC 102. Additionally, the interface 114 may include a System Virtual Interface Definition (SVID) virtual interrupt for handling IC power-supply pins, voltage rail settings, and system control signals or a standard interface, e.g., System Power Management Interface (SPMI) that can be used on a power management IC.

In examples, where the I/O device interface 110 includes a USB PHY subsystem, the power source 112 can include analog blocks related to the USB PHY subsystem, such as VBUS and ID logic. Further, any other detection logic and circuit blocks typically associated with the USB PHY subsystem may be relocated to the power source 112. This relocation enables the USB PHY subsystem to be power gated, and firmware to communicate and convey USB related events to the SOC 102. In this manner, I/O power leakage from the SOC 102 can be substantially minimized.

The main processor 104 may be linked through the system bus 108 to a display interface 116 adapted to connect the SOC 102 to a display device 118. The display device 118 may include a display screen that is a built-in component of the SOC 102. The display device 118 may also include a computer monitor, television, or projector, among others, that is externally connected to the SOC 102. Moreover, the display device can be integrated into the SOC 102. For example, the display device 118 may be a touchscreen. The SOC 102 may also include a storage device 120. The storage device 120 may include a physical memory such as a hard drive, an optical drive, a flash drive, an array of drives, or any combinations thereof. The storage device 120 may also include remote storage drives accessed via a network. In some cases, the storage device 120 is external to the SOC.

The SOC 102 may also include a network interface controller (NIC) 122 configured to connect the SOC 102 through the bus 108 to a network 124. The network 124 may be a wide area network (WAN), local area network (LAN), or the Internet, among others.

It is to be understood that the block diagram of FIG. 1 is not intended to indicate that the electronic computing system 100 is to include all of the components shown in FIG. 1. Rather, the electronic computing system 100 can include fewer or additional components not illustrated in FIG. 1 (e.g., additional memory devices, video cards, additional network interfaces, etc.).

Figure 2:
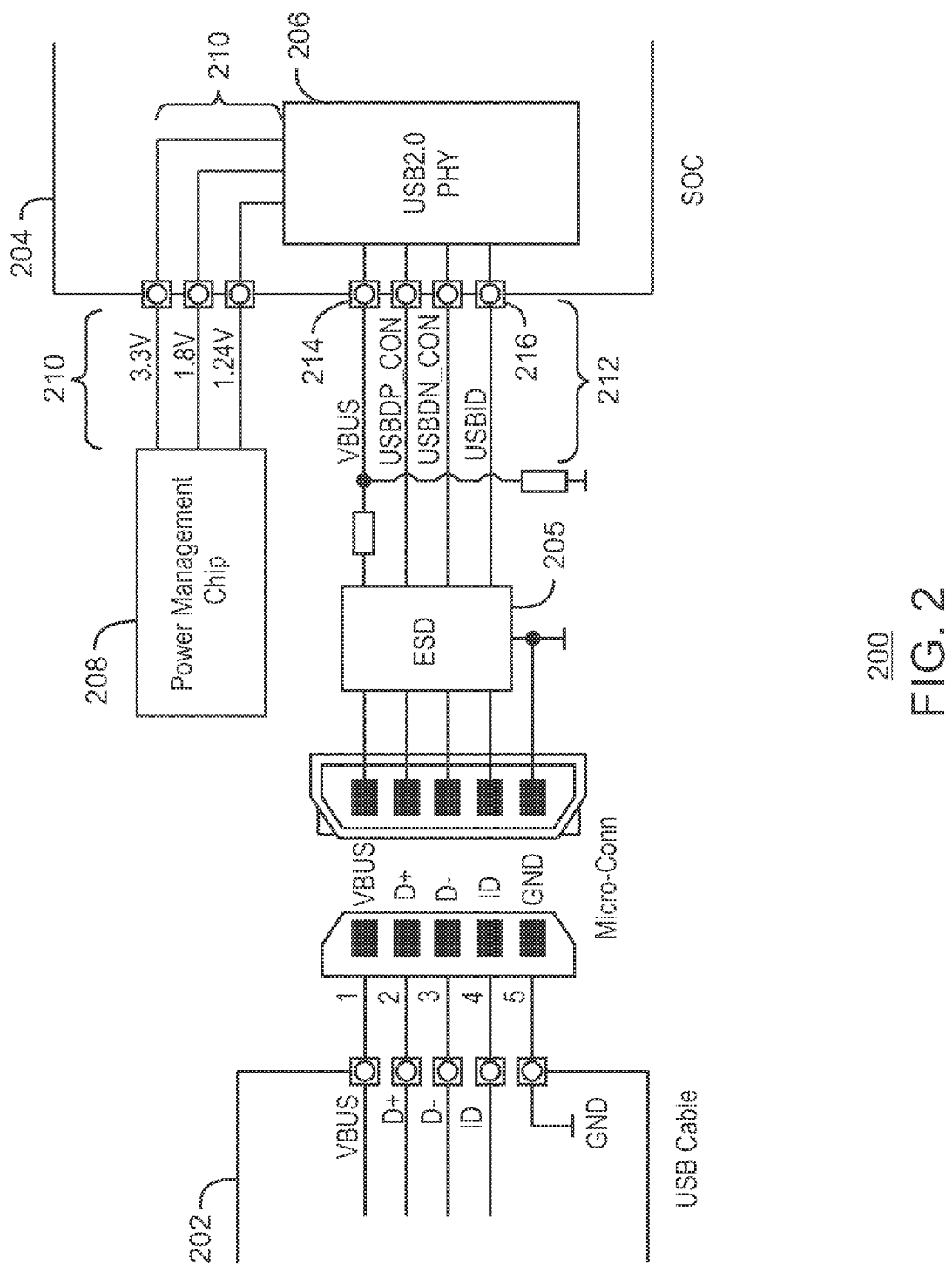
FIG. 2 is an illustration of a typical Universal Serial Bus 2.0 (USB) port subsystem on a system on chip (SOC) within an electronic computing system.

FIG. 2 is an illustration of a typical Universal Serial Bus 2.0 (USB2.0) port subsystem on a system on chip (SOC) within an electronic computing system 200. Although a typical USB2.0 system is used for descriptive purposes, the present techniques may apply to any USB system. As shown in FIG. 2, a USB cable 202 may be configured to connect or be coupled with an SOC 204 via a micro-connection. The SOC 204 may include an electrostatic discharge (ESD) detection circuit 205. The ESD detection circuit 205 may be implemented to detect generated positive and negative electrical disturbances that may affect the performance of the SOC 204. As a result, the ESD direction circuit 205 may considered all current paths and all voltage-buildup scenarios in the protection and internal circuits of the SOC 204 to avoid material damage. The SOC 204 may also include a USB PHY subsystem 206. The SOC 204 can include associated bump pads and ball pads (not shown), which may have an impact on the size of the SOC 204 and the electronic computing system 200. The bump pads and ball pads may be used to couple or integrate the USB PHY subsystem 206 with the SOC 204. The USB PHY subsystem 206 can be connected to a power source, such as a power management apparatus or logic, such as power management chip 208, by using power rail pin inputs 210.

Data path pin connections 212 may communicate data from the USB cable 202 to the USB PHY subsystem 206. In operation, the power management chip 208 may be implemented for controlling power levels to the SOC 204 and to one or more inputs utilized for receiving inputs from a device(s) coupled to the SOC 204. The USB PHY subsystem 206 may use a 3.3V power rail, as shown in FIG. 2 by the power rail pin inputs 210. Other input power rails, including 1.8V and 1.2 V as shown by the power rail pin inputs 210, may facilitate the implementation of specific and shared SOC power rails.

A $V_{BUS}$ detection pin 214 and an ID detection pin 216 are related to USB wake functionality and USB2.0 On-the-Go (OTG) functionality. The wake functionality may be implemented to wake up a portion of the system 200 from a standby mode or sleep mode based on input signals from the $V_{BUS}$ detection pin 214 and the ID detection pin 216. The OTG functionality may facilitate the connectivity of portable devices to supported USB products connected to the electronic computing system 200. In particular, the $V_{BUS}$ detection pin 214 and the ID detection pin 216 may be related to the USB2.0 OTG functionality in order to sense a USB cable attachment or detachment event. However, the wake functionality, along with high-voltage analog blocks including analog comparators, current/voltage bias generators, and clock timers associated with OTG functionality, may contribute to excessive power consumption and increased power leakage when located within the SOC 204.

Figure 3:
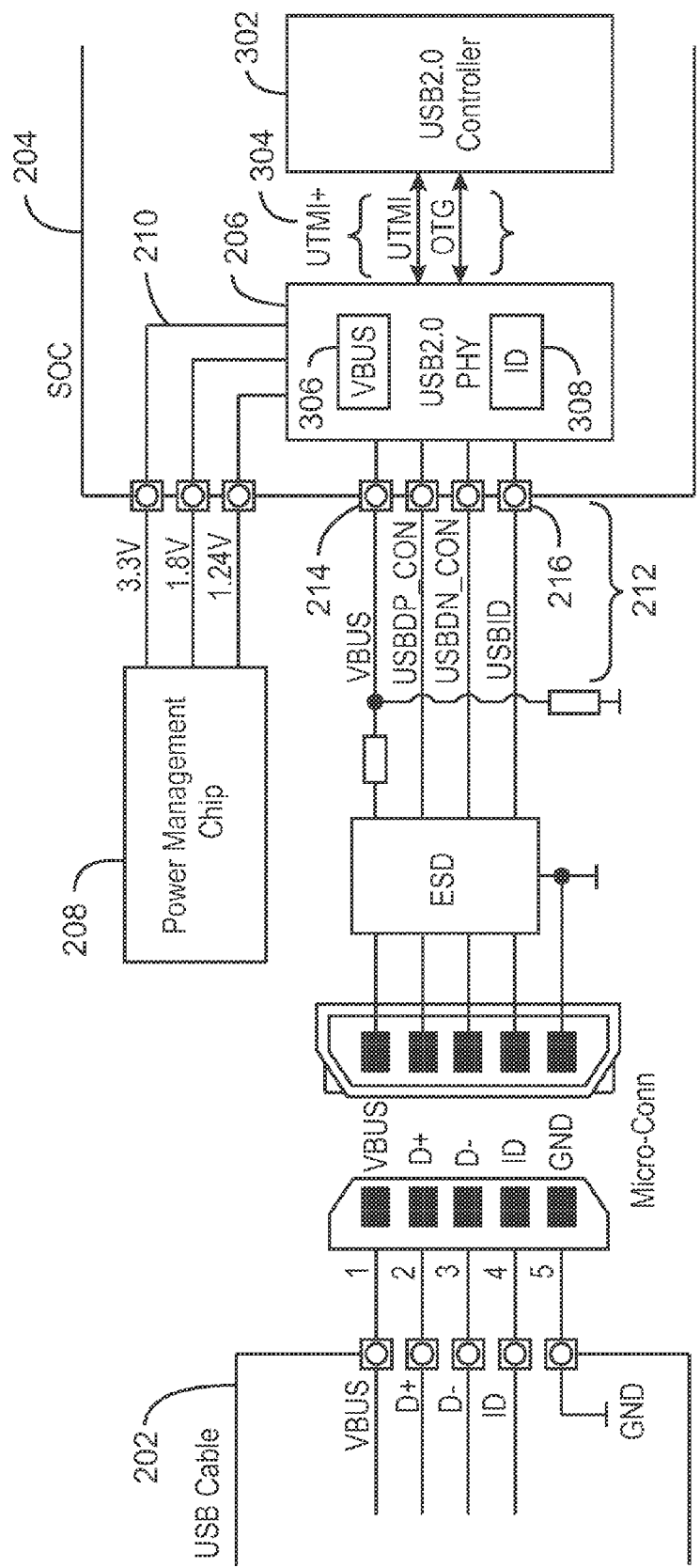
FIG. 3 is a detailed illustration of an electronic computing system including a Universal Serial Bus 2.0 (USB) cable configured to couple to an SOC, including a $V_{BUS}$ detection block and an ID detection block located on the SOC.

FIG. 3 is a detailed illustration of an electronic computing system 300 including a Universal Serial Bus 2.0 (USB) cable 202 configured to couple to an SOC 204, including a $V_{BUS}$ detection block and an ID detection block located on the SOC. Like numbers will be discussed with respect to FIG. 2. As shown in FIG. 3, the SOC 204 can include both a USB PHY subsystem 206 and a USB2.0 controller 302. A USB2.0 Transceiver Macrocell Interface (UTMI+) bus protocol 304 may be used to connect the USB PHY subsystem 206 to the USB2.0 controller 302 on the SOC 204. The UTMI+ bus protocol 304 may include input and output signals, e.g., utmi_vbusvalid, utmi_iddig, and the like, that can be derived by sensing a $V_{BUS}$ detection pin 214 and an ID detection pin 216.

The input and output signals may also support the OTG functionality. In embodiments, the $V_{BUS}$ detection pin 214 and the ID detection pin 216 may indicate a state change when a USB cable 202 is attached or detached to the electronic computing system 300. This data can be communicated from the USB PHY subsystem 206 to the USB2.0 controller 302 over the UTMI+ bus protocol 304 to process a signal to wake the USB PHY subsystem 206 from a stand-by or sleep mode, thereby invoking the USB wake functionality.

As shown in FIG. 3, the USB PHY subsystem 206 includes a $V_{BUS}$ detection block 306 and an ID detection block 308. The $V_{BUS}$ detection block 306 and ID detection block 308 can embody high-voltage analog blocks (not shown), e.g., analog comparators, current/voltage bias generators, clock timers, that contribute to a higher percentage of the total power consumed due. Additionally, any detection circuit blocks and logic associated with the detection circuit blocks that maintain a power-ON status may be grouped together with the analog blocks. The $V_{BUS}$, ID, and detection blocks of the USB PHY subsystem 206 may each use a 3.3V voltage rail and may maintain a continuous power-ON status during system standby. These components may be a leading contributor to a high leakage of power and a major proportion of power usage.

Figure 4:
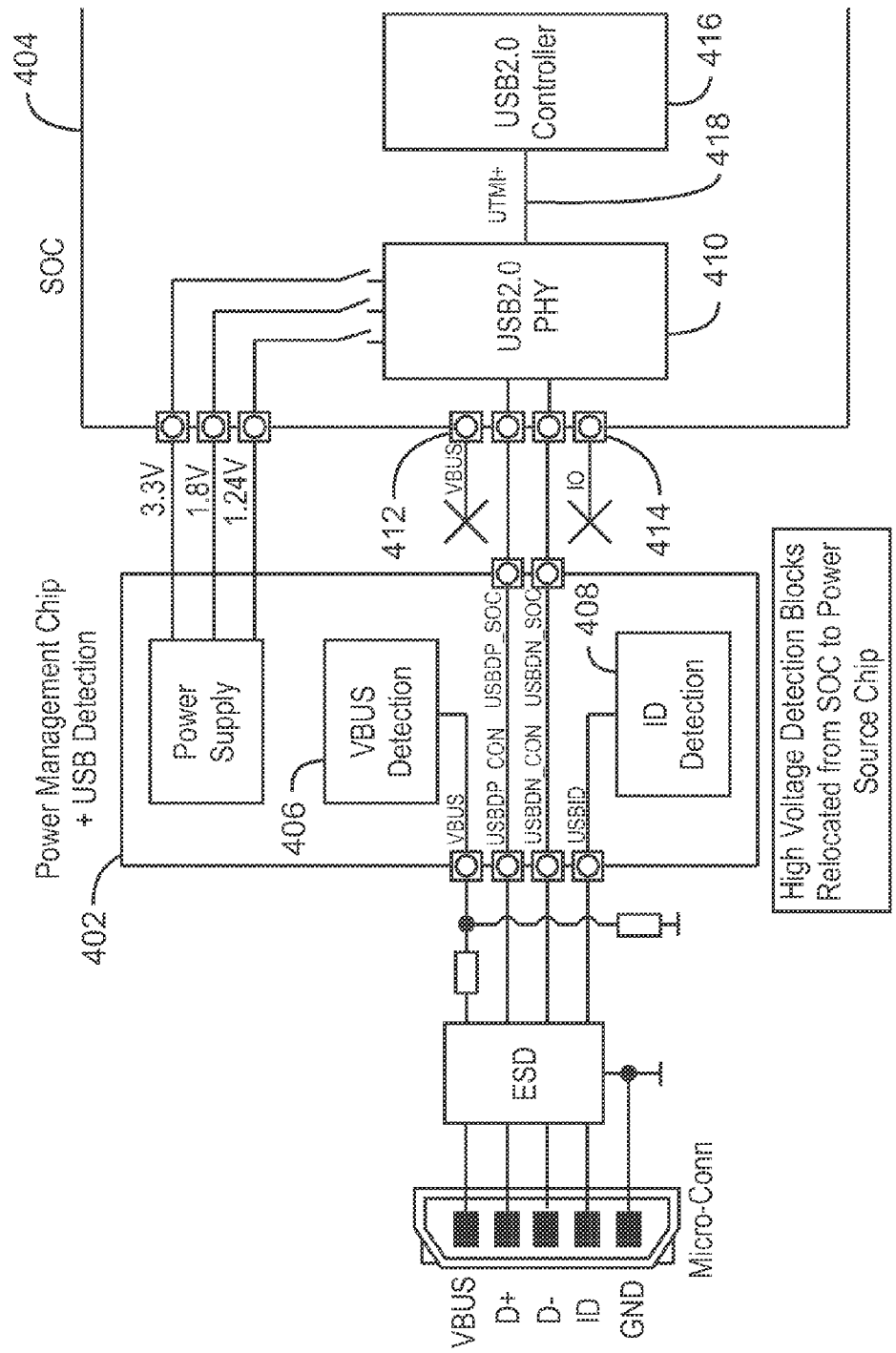
FIG. 4 is an illustration of an electronic computing system including a power management chip and an SOC.

FIG. 4 is an illustration of an electronic computing system 400 including a power management apparatus or logic, such as power management chip 402 and an SOC 404. The $V_{BUS}$ logic and ID logic has been relocated from the SOC 404 to the power management chip 402. As previously stated, the combination of a high pad voltage and a continuous power-ON status requirement for an SOC may contribute to an increase in total power consumed. To combat such issues, the electronic computing system 400 illustrates the relocation of high-voltage analog blocks from the SOC that utilizes power-gates to completely or partially shut-down power to and from the SOC, without compromising wake, OTG, and UTMI+ functionalities.

The implementation of power-gates may include two-steps. The first step may include combining and relocating the high-voltage analog blocks associated with wake functionality and OTG functionality to a power source, e.g. a power management apparatus or logic, which in operation maintains a continuous power-ON status. Thus, the analog blocks that consume a higher voltage are relocated to a higher power domain. From the power management apparatus or logic, signals related to detecting a wake event may be generated, processed, and transmitted to other components, e.g., an SOC. The second step may include enabling SOC system firmware to provide a handshake protocol between the SOC and the power management apparatus or logic so that the SOC may accept and respond to the signals as received from the power management apparatus or logic. The signals may be related to USB related events including cable detachment or cable attachment. Other USB related events may include power, reset, suspend, resume, error, among other events that may signal a change to the electronic computing system 400. The wake functionalities of the high-voltage analog blocks may include a real-time clock (RTC) or an always-on timer. Both the RTC and the always-on timer may be programmed to awake the SOC from a deep idle state. Concerning OTG functionality, the electronic computing system 400 may act as either a host to select USB or OTG peripherals, as a peripheral to standard USB, or as OTG dual-role hosts.

As shown in FIG. 4, the electronic computing system 400 may include a power management chip 402, including USB+ detection, and an SOC 404. Unlike the typical electronic computing systems, as detailed in FIGS. 2 and 3, a $V_{BUS}$ detection block 406 and the ID detection block 408, including all associated logic, can be relocated from a USB PHY subsystem 410 to the power management chip 402. Additionally, high-voltage analog blocks associated with wake and OTG functionalities, analog comparators, current/voltage bias generators, wake timers, digital FSM, among others, can also be relocated to the power management chip 402. With the partitioning of the high-voltage blocks associated with wake and OTG functionalities and the removal of the $V_{BUS}$ pin 412 and ID detection pin 414, the USB PHY subsystem 410 and a USB2.0 controller 416 may remain on the SOC 404. A UTMI+ bus protocol 418 may be utilized to provide connectivity between USB PHY subsystem 410 and the USB2.0 controller 416.

The partitioning and relocation to a higher power domain on the power management chip 402 may facilitate a more suitable environment for the high-voltage functionalities and blocks since a continuous power-ON status may be maintained independent of the SOC 404. Thus, the issue of high leakage associated with the SOC 404 may be alleviated.

The partitioning and relocating of the high-voltage functionalities and analog blocks may facilitate a design option to completely shut-down power to the SOC 404 through the use of power gating. Power gating is a technique used in IC design to reduce power consumption or leakage power, by shutting off power to input/output blocks that are not currently in use. Local power-gating can be adopted if any of the input power-rails are shared by other input/output blocks. As shown in FIG. 4, the power rails electrically connected to the USB PHY subsystem 410 may be gated to facilitate power-gating to the SOC 404. In operation, this may reduce power leakage from the USB PHY subsystem 410 by shutting off the power supply to the USB PHY subsystem 410. By blocking power to the USB PHY subsystem 410 through power-gating and relocating high-voltage blocks to the power management chip 402, the requirement to keep analog blocks active and awake on the SOC 404 in order to detect USB related events can be eliminated. The use of power-gating may also lower the occurrence of high leakage from the SOC 404 since the SOC 404 may enter into sleep or stand-by modes for longer periods of time. Additionally, bump pads and ball pads associated with the relocated functionalities and blocks may be eliminated, thus, possibly lending to a cost reduction in SOC fabrication.

Figure 5:
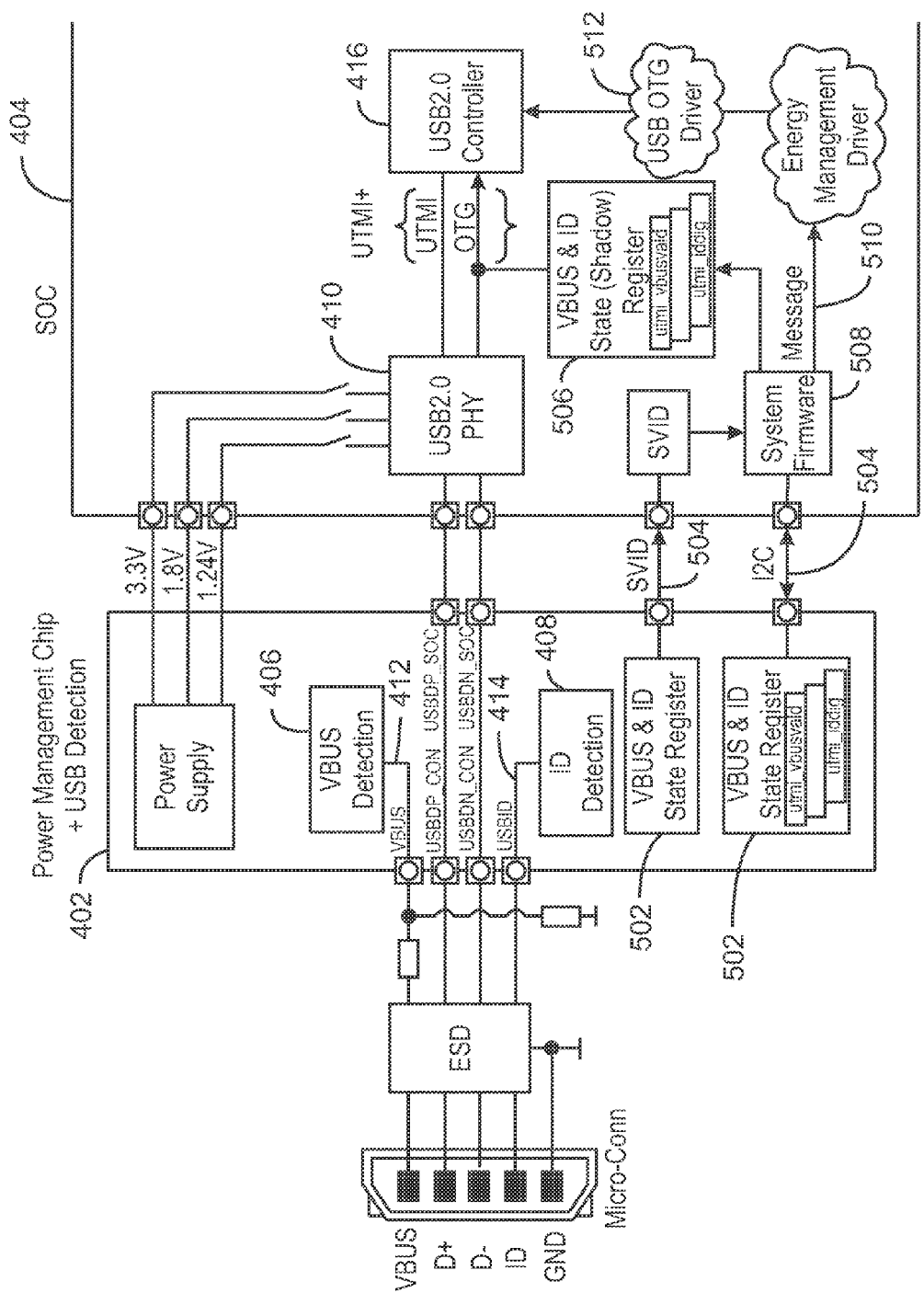
FIG. 5 is a detailed illustration of FIG. 4 for an electronic computing system including a power management chip and an SOC, including the relocation of $V_{BUS}$ logic and ID logic to the power management chip.

FIG. 5 is a detailed illustration of FIG. 4 for an electronic computing system 500 including a power management chip and an SOC, including the relocation of $V_{BUS}$ logic and ID logic to the power management chip. Like numbers will be discussed with respect to FIG. 4. In addition to the $V_{BUS}$ block 406 and ID detection block 408, the power management chip 402 may include UTMI+ registers 502, e.g., local $V_{BUS}$ & ID state registers, utilized to record state changes, i.e., $V_{BUS}$ and ID pin value changes. As a hardware mechanism, the UTMI+ registers 502 may act to mimic the function of UTMI+ input and output signals, e.g., utmi_vbusvalid, utmi_iddig, and the like.

A $V_{BUS}$ pin 412 and an ID detection pin 414 associated with the $V_{BUS}$ block 406 and the ID detection block 408 include components for interacting with the circuitry of the power management chip 402. Each pin 412 and 414 may be enabled to generate a wake up event to cause the electronic computing system 500 to exit from a sleep mode or stand-by mode when a USB related event is detected. The value changes for the $V_{BUS}$ pin 412 and the ID detection pin 414 generated in the power management chip 402 may be sent to the SOC 404 as a virtual interruption using an interface 504. The interface 504 may include a System Virtual Interface Definition (SVID) interface, an $I_2C$ data path, or any type of interface utilized to provide a physical connection to transfer data between the SOC 404 and the power management chip 402.

The SOC 404 may maintain a shadow copy of the UTMI+ registers 502, in the form of a UTMI+ shadow register 506, where the $V_{BUS}$ 412 and ID pin 414 value changes may be refreshed by SOC firmware 508 as a part of routine service. In particular, the UTMI+ shadow register 506 may drive the UTMI+ signals, utmi_vbusvalid and utmi_iddig, of the UTMI+ registers 502. Additionally, the UTMI+ shadow register 506 on the SOC 404 may connect to a USB PHY subsystem 410 and a USB controller 416. Thus, the SOC firmware 508 may work with a USB OTG Driver 512 to enable power-gating signals to the USB PHY subsystem 410, to initiate the actual wake event.

As shown in FIG. 5, the UTMI+ registers 502 on the power management chip 402 may also trigger virtual interrupts to the SOC 404 via a SVID interface 504 and an $I_2C$ data path 504. The SVID interface 504 may trigger the SOC firmware 508 to send messages 510 to a processor (not shown) to invoke the USB OTG Driver 512. The configuration of the SOC firmware 508 and the USB OTG Driver 512 may be implemented to communicate the USB related events, e.g., cable events, to the SOC 404.

Accordingly, the firmware 508 can communicate and convey USB related events. In this manner, wake functionality is implemented through firmware. Further, the firmware and a USB driver are used to enable power gating to the USB subsystem. Moreover, a handshake between the SVID interface and the USB driver will enable closed loop wake detection and other USB actions.

Figure 6A:
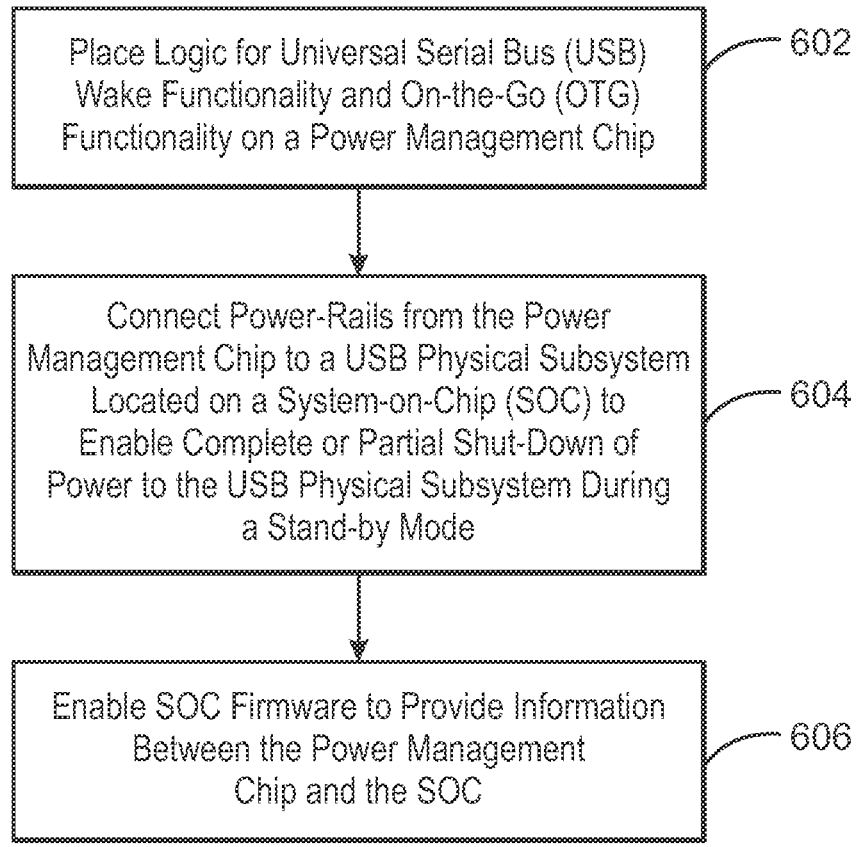
FIG. 6A is a method for minimizing power leakage of a device.

FIG. 6A is a method for minimizing power leakage of a device. At block 602, logic for Universal Serial Bus (USB) wake functionality and On-the-Go (OTG) functionality may be placed on a power management apparatus or logic. The USB wake and OTG functionalities may be partitioned and relocated from an SOC to the a power management chip in an effort to eliminate and reduce leakage power from the SOC. In some cases, any USB functionality powered by the 3.3V rail is placed on the power management chip. At block 604, power-rails from the power management chip may be connected to a USB physical subsystem located on a system-on-chip (SOC) to enable complete or partial shut-down of power to the USB physical subsystem during a stand-by mode. Power-gating may be utilized to reduce power leakage from the SOC since it may be possible to completely shut-down power via the power rails to the USB physical subsystem during a sleep or stand-by mode. At block 606, SOC firmware may be enabled to provide information between the power management chip and the SOC. In particular, the firmware is used to communicate or convey USB events related the USB functionality on the power management chip to the USB PHY subsystem according to a USB specification.

Figure 6B:
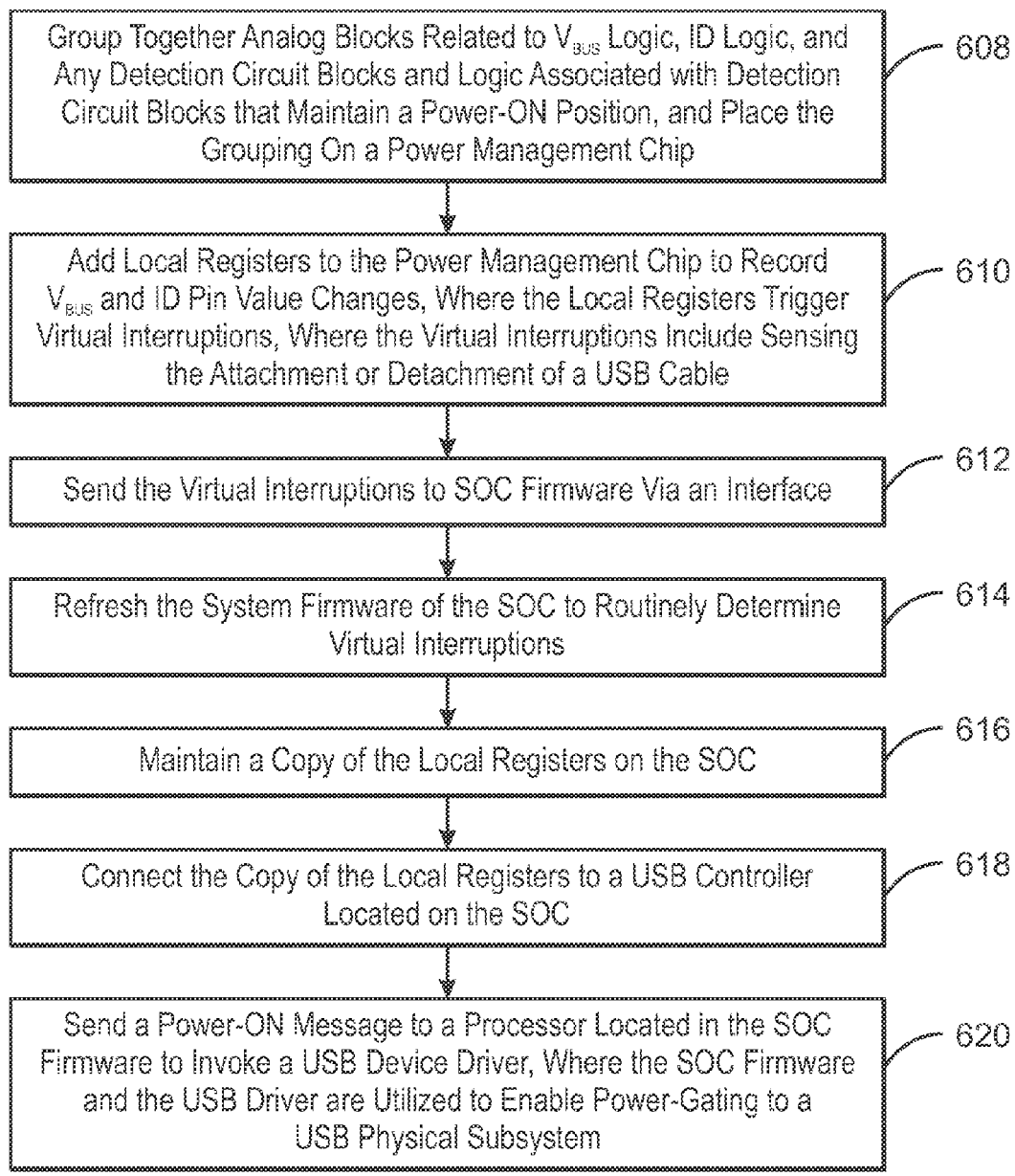
FIG. 6B is a detailed method for minimizing power leakage of a device.

FIG. 6B is a detailed method for minimizing power leakage of a device. At block 608, analog blocks related to $V_{BUS}$ logic, ID logic, and any detection circuit blocks and logic associated with detection circuit blocks that maintain a power-ON position, may be grouped together and placed on the power management chip, as referenced with respect to block 602. The power management chip may include high-voltage islands that maintain a power-ON status independent of the SOC as referenced with respect to block 604. Collectively, the high voltage islands of the power management chip can accommodate different high-voltage analog blocks running at various voltage levels. Accordingly, the aforementioned analog blocks, which may embody high-voltage, can be supported by the power management chip in an effort to prevent consumption or leakage of excessive amounts of power. At block 610, local registers may be added to the power management chip to record $V_{BUS}$ and ID pin value changes, where the local registers trigger virtual interruptions and where the virtual interruptions include sensing the attachment or detachment of a USB cable. At block 612, the virtual interruptions may be sent to SOC firmware, as referenced with respect to block 606, via an interface. At block 614, the system firmware of the SOC may be routinely refreshed to determine the virtual interruptions. The SOC, which no longer includes the high voltage analog blocks, may be in a deep sleep state and thus, the virtual interruptions may provide an indication to the SOC that activity is occurring. As a part of the virtual interruption service routine, the SOC may maintain a copy of the local registers on the SOC at block 616. At block 618, the copy of the local registers on the SOC may be connected to a USB controller located on the SOC. At block 620, the USB controller, in conjunction with a UTMI+ bus, may send a power-ON message to a processor located in the SOC firmware to invoke a USB device driver. The SOC firmware and the USB driver may be utilized to enable power-gating to the USB physical subsystem. The use of power-gating may completely or partially shut-down power to and from the SOC, without comprising the USB wake and OTG functionalities, as referenced with respect to block 602.

Figure 7:
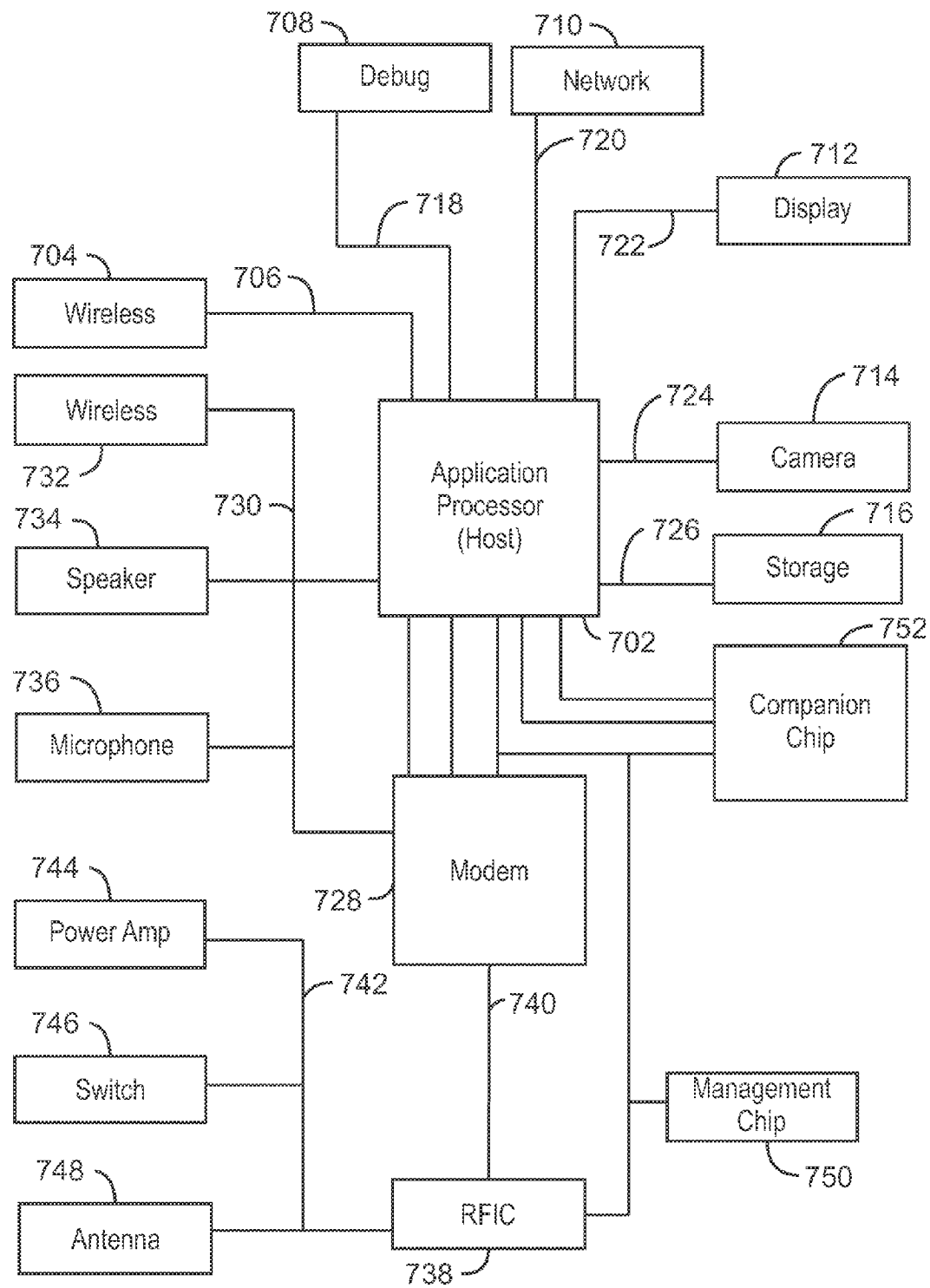
FIG. 7 is a block diagram of a detailed example of a low power-computing platform.

FIG. 7 is a block diagram of a detailed example of a low power-computing platform 700. In one embodiment, the low power-computing platform 700 may include user equipment (UE), which can refer to a device used for communicating, such as a device with voice communication capability. In one or more embodiments, the UE may include a phone, a smartphone, a tablet, an ultraportable notebook, or a low power notebook. The low power-computing platform 700 may include a number of different interconnects to couple multiple different devices. Exemplary discussion of these interconnects are provided below to facilitate options for a user during implementation and inclusion of the embodiments disclosed herein. It should be noted that the disclosed low power-computing platform 700 is not required to include or implement the interconnects or devices as described herein. Thus, other devices and interconnect structures that are not specifically shown may be included.

As shown in FIG. 7, the low power-computing platform 700 may include a processor 702. Often this includes a low-power processor, which may be a version of a processor configuration described herein or known in the industry. In one or more embodiments, the processor 702 may be implemented as a system-on-chip (SOC). Specifically, the processor 702 may include an Intel® Architecture Core™-based processor, such as an i3, i5, or i7, or other lower-power processors. In one or more embodiments, the processor 702 may run an operating system, a user interface, and various other applications. The processor 702 may recognize or may be associated with an Instruction Set Architecture (ISA) that the operating system, the user interface, and the various applications can utilize to direct the operation/execution of the processor 702. Additionally, the processor 702 may interface with sensors, cameras, displays, microphones, and mass storage, as will be later discussed.

As shown in FIG. 7, the processor 702 can be coupled to a wireless interface 704, such as WLAN, WiGig, WirelessHD, or other wireless interfaces. A compliant interconnect, 706, including a Low Latency Interface (LLI), a SuperSpeed Inter-Chip (SSIC), or (Universal Protein Resource) UniPort, can be utilized to couple the processor 702 and the wireless interface 704. The LLI interconnect may enable memory sharing between the two devices. In particular, a bi-directional interface may transport memory transactions between the two devices and allow one of the devices to access the local memory of another device. This may be done without software intervention, as if it were a single device. In one or more embodiments, the aforementioned LLI interconnect may allow for various classes of traffic, the carrying of signals over the link, and the reduction of the GPIO count. As an example, the LLI interconnect may define a layered protocol stack for communication or a physical layer (PHY), such as an M-PHY or a D-PHY.

The SSIC interconnect may enable the design of high-speed USB devices using a low-power physical layer. For example, an M-PHY layer may be utilized, while USB 3.0 compliant protocols and software may be utilized over the M-PHY for better power performance. Moreover, the UniPro interconnect includes a layered protocol stack with a physical layer abstraction. The UniPro interconnect may provide a general purpose including error-handling, high speed solution for interconnecting a broad range of devices and components including application processors, co-processors, modems, and peripherals, as well as, supporting different types of data traffic including control messages, bulk data transfer, and packetized streaming. The UniPro interconnect may support usage of an M-PHY or a D-PHY. Furthermore, as shown in FIG. 7, other interfaces may also couple directly to the processor 702, including a debug 708, a network connection 710, a display 712, a camera 714, and a storage 716. The debug 708 and the network connection 710 may communicate with the processor 702 through a debug interface 718, e.g., PTI, and a network connection 720, e.g., a debug interface that operates over the network connection 710, respectively.

The display 712 may include one or more displays. In one or more embodiments, the display 712 can include a display with one or more touch sensors capable of receiving/sensing touch input. As shown in FIG. 7, the display 712 can be coupled to the processor 702 through a display interface (DSI) 722 to define protocols between the processor 702 and the display 712. The DSI 722 may typically adopt pixel formats and a defined command set for video formats and signaling, such as a Display Pixel Interface 2 (DPI-2) and control display module parameters, such as through a Display Command Set (DCS).

The camera 714 may include an image sensor used for still pictures, video capture, or both, where front and back-side cameras are common on many mobile devices. In one or more embodiments, dual-cameras may be used to provide stereoscopic support. FIG. 7 depicts the camera 714 coupled to the processor 702 through a peripheral interconnect, such as a camera interface specification (CSI) 724. The CSI 724 defines an interface between a peripheral device (e.g., camera, Image Signal Processor) and the processor 702. In one or more embodiments, image data from the camera 714 may be transferred over a D-PHY or a unidirectional differential serial interface with data and clock signals.

In one or more embodiments, the storage 716 may include a non-volatile memory used by the processor 702 to store large amounts of information. It may be based on flash technology or a magnetic type of storage, such as a hard-disk. As shown in FIG. 7, the storage 716 may be coupled to the processor 702 through Universal Flash Storage (UFS) interconnect 726. The UFS 726 may include an interconnect that is tailored for low-power computing platforms, such as mobile systems. For example, the UFS 726 may provide between 200 and 500 MB/s transfer rate (e.g., 300 MB/s) utilizing queuing features to increase random read/write speeds. In particular, the UFS 726 may use an M-PHY physical layer and a protocol layer, such as the UniPro.

As shown in FIG. 7, a modem 728 may act as an interface to a cellular network (e.g., RFIC network). The modem 728 may be capable of communicating with different networks types and different frequencies, depending on the type of communication standard that is utilized. In one or more embodiments, both voice and data connections can be supported. A shown in FIG. 7, the modem 728 may be coupled to the processor 702 via one or more known interconnects, such as one or more of LLI, SSIC, UniPro, Mobile Express, etc.

In one or more embodiments, a control bus 730 can be utilized to couple control interfaces or data interfaces, such as a wireless interface 732, a speaker 734, and a microphone 736. An example of such a bus may include a flexible low-power multi-drop interface, such as a (Serial Low-power Inter-chip Media Bus) SLIMbus, that is a capable of supporting a wide range of audio and control solutions. The wireless interface 732 may include an interface, such as a short range communication standard between two devices (e.g., Bluetooth or NFC), a navigation system capable of triangulating position and/or time (e.g., GPS), a receiver for analog or radio broadcasts (e.g., FM Radio), or other known wireless interfaces or standard interfaces. The speaker 734 may include any device to generate sound, such as an electromechanical device to generate ringtones or music. In one or more embodiments, multiple speakers may be used for stereo or multi-channel sound and the microphone 736 may be used for voice input, such as talking during a call.

A Radio Frequency Integrated Circuit (RFIC) 738 may perform analog processing, such as processing of radio signals including amplification, mixing, filtering, and digital conversion. As depicted in FIG. 7, the RFIC 738 can be coupled to the modem 728 through an interface 740. In one or more embodiments, the interface 740 can include a bi-directional, high-speed interface (e.g. DigRF) that can support communication standards, such as LTE, 3GPP, EGPRS, UMTS, HSPA+, and TD-SCDMA. For example, the DigRF may utilize a frame-oriented protocol based on an M-PHY physical layer. Furthermore, the DigRF may be referred to as RF friendly while embodying low latency and low power with optimized pin count.

An interface 742 (e.g., a RF control interface) connected to the RFIC 738 can include a flexible bus to support simple to complex devices. For example, the interface 742 may include a flexible two-wire serial bus that can be designed for control of various RF Front-End components. In particular, a bus master may write and read to multiple devices, such as a power amplifier 744 to amplify the RF signal, a switch module(s) 746 to switch between RF signal paths depending on a network mode, and antenna tuners 748 to compensate for bad antenna conditions or enhancing bandwidth. Moreover, in one or more embodiments, the interface 742 may embody a group trigger function for timing-critical events and low electromagnetic interference (EMI or radio-frequency interference (RFI) when in radio frequency).

As shown in FIG. 7, a management chip 750 may be used to provide all the different components in the mobile device 700 with power-managed voltage, where the voltage may include decreasing voltage or increasing voltage to improve efficiency for components in a mobile device. In one or more embodiments, the management chip 750 may also control and monitor the charge of a battery (not shown) and its remaining energy. A battery interface may be utilized between the management chip 750 and the battery. As an example, the battery interface may include a single-wire communication between a mobile terminal and smart/low cost batteries. Additionally, a companion chip 752 may be used to couple the management chip 750 to the processor 702, the modem 728, the RFIC 738, and various other components of the platform 700. In operation, the companion chip 752 may be included in the platform 700 to expand the capabilities of the processor 702 by adding features that may be missing and by offloading high-speed processing tasks.

With the wake and OTG functionalities relocated from the SOC, the management chip may now support the basic wake and OTG functions. As a result, USB related events, including cable attachment or detachment, and wake functions may be generated and transmitted from the management chip to the SOC. The SOC may include SOC firmware to receive and process the related events. Power management has become increasingly important, particularly in portable devices, in order for the devices to have practical use. Through the use of wake functionality and OTG functionality, such devices may be placed in a sleep or low-power state, e.g., stand-by mode, to conserve power during non-usage and possibly extend battery life. However, the high-voltage wake and OTG functionalities embedded within an SOC may be a leading cause of power leakage. The present disclosure provides for the grouping and relocation of such functionality to a power management apparatus or logic, which includes high-voltage islands that maintain a continuous power-ON state. Since power management can utilize a manufacturing process technology node that generally has a lower power leakage than that of an SOC, the relocation of high-voltage analog blocks into a higher power domain may prove to eliminate I/O power drain for an electronic computing system during stand-by or sleep modes. Thus, it may be advantageous to grouped together and relocate high-voltage analog blocks from an SOC to a power management apparatus or logic.

Example 1

A system to minimize power leakage is described herein. The system includes a system-on-chip (SOC) and a power management logic. The SOC includes a Universal Serial Bus (USB) physical subsystem to receive USB related events. The system includes a power management logic that includes USB wake functionality and USB On-the-Go (OTG) functionality.

The USB physical subsystem may be completely power-gated. The system may include gated power-rails that may completely or partially shut-down power to the USB physical subsystem to place the USB physical subsystem in a stand-by mode. The USB wake functionality and USB OTG functionality may be located on the power management logic, and a USB 2.0 Transceiver Macrocell Interface (UTMI+) bus protocol may be preserved. Additionally, the USB wake functionality and the OTG functionality may include a $V_{BUS}$ detection block, an ID detection block, logic related to $V_{BUS}$ and ID pins, wake timers, and a digital finite-state machine (FSM). Further, the power management logic may include local registers to record $V_{BUS}$ and ID pin value changes that signal whether a USB cable is either attached or detached to the system. The pin value changes may be sent to the SOC as a virtual interruption via interfaces. Further, the local registers on the power management logic may provide bus signals to preserve the UTMI+ bus protocol. The interfaces may include System V Interface Definition (SVID) virtual interrupt, an I2C data path, or any type of interface utilized to provide a physical connection to transfer data between the SOC and the power management logic. Additionally, the SOC may include system firmware to receive the virtual interruption. The virtual interruption may be sent to a processor located on the SOC and the virtual interruption may awake the USB physical subsystem from a stand-by mode by providing electrical connectivity via gated power-rails to the USB physical subsystem. The system firmware may include a handshake protocol that may communicate and respond to USB related events between the power management logic and the system firmware. Additionally, the SOC may maintain a copy of the local registers and the local registers may be connected to a USB controller. Further, a USB interface may be used to connect the USB physical subsystem with a USB controller. All bump pads or ball pads associated with the USB wake functionality and USB On-the-Go functionality may be removed from the SOC.

Example 2

A method for minimizing power leakage is described herein. The method includes placing logic for Universal Serial Bus (USB) wake functionality and On-the-Go (OTG) functionality on a power management apparatus. Additionally, the method includes connecting power-rails from the power management apparatus to a USB physical subsystem located on a system-on-chip (SOC) to enable complete or partial shut-down of power to the USB physical subsystem during a stand-by mode. The method further includes enabling SOC firmware to provide information between the power management apparatus and the SOC.

The method may group analog blocks related to $V_{BUS}$ logic, ID logic, and any detection circuit blocks and logic associated with detection circuit blocks that maintain a power-ON position, and place the grouping on the power management apparatus. The USB wake functionality and the OTG functionality may include a $V_{BUS}$ detection block and an ID detection block that can provide $V_{BUS}$ and ID pin value changes to indicate the attachment or detachment of a USB cable. Additionally, the OTG functionality may include analog comparators, current/voltage bias generators, and clock timers. The method may add local registers to the power management apparatus to record the $V_{BUS}$ and ID pin value changes. The local registers may trigger virtual interruptions, wherein the virtual interruptions may sense the attachment or detachment of a USB cable. The virtual interruption may be sent to SOC firmware via interface and the SOC firmware may routinely determine virtual interruptions. Additionally, the SOC may maintain a copy of the local registers, wherein the copy of the local registers may be connected to a USB controller located on the SOC.

Example 3

A power management apparatus is described herein. The power management apparatus includes a power supply block, a $V_{BUS}$ detection block and an ID detection block, and a $V_{BUS}$ and ID state register. Further, the power supply block is to be connected via power rails to a USB physical subsystem that is to be located on a system-on-chip (SOC).

The power management apparatus may remain in a power-ON state independent of the USB physical subsystem. Additionally, the $V_{BUS}$ detection block and the ID detection block may be analog blocks that remain in a power-ON state. Further, the $V_{BUS}$ and ID state register may record $V_{BUS}$ and ID pin value changes during attachment or detaching of a Universal Serial Bus (USB) cable and may send the $V_{BUS}$ and ID pin value changes to the USB physical subsystem as virtual interruptions via an interface. Additionally, a wake function of the USB physical subsystem may be supported by the power management apparatus, wherein the wake function may change the status of the USB physical subsystem from a stand-by mode to wake mode.

Example 4

A system to minimize power leakage is described herein. The system includes a means to position USB wake functionality and OTG functionality on a power management apparatus. Additionally, the system includes a means to electrically connect power-rails to a (Universal Serial Bus) USB physical subsystem.

The power management apparatus may include a power supply block, a $V_{BUS}$ detection block, an ID detection block, and a $V_{BUS}$ and ID state register. Additionally, the power supply block may be connected to a USB physical subsystem located on a system-on-chip (SOC) via gated power-rails. The system may include a means to signal $V_{BUS}$ and ID pin value changes. Further, the system may include a means to record $V_{BUS}$ and ID pin value changes during attachment or detachment of a USB cable and a means to send the $V_{BUS}$ and ID pin value changes to the USB physical subsystem as virtual interruptions via an interface. The system may add local registers to the power management apparatus to record the $V_{BUS}$ and ID pin value changes, wherein the local registers may trigger virtual interruptions, and wherein the virtual interruptions may sense the attachment or detachment of a USB cable. Additionally, the system may include a means to send the virtual interruptions to the SOC firmware. Further, the system may include a means to change the status of the USB physical subsystem from a stand-by mode to wake mode that may be supported by the power management apparatus.

Example 5

A tangible, machine-readable medium comprising code is described herein. The code, when executed, causes a processor to place logic for Universal Serial Bus (USB) wake functionality and On-the-Go (OTG) functionality on a power management apparatus. Additionally, the code, when executed, causes a processor to connect power-rails from the power management apparatus to a USB physical subsystem located on a system-on-chip (SOC) to enable shut-down of power to the USB physical subsystem during a stand-by mode. Further, the code, when executed, causes a processor to enable SOC firmware to provide information between the power management apparatus and the SOC.

A portion of USB functionality that consumes power from a higher power domain may be stored on the power management apparatus. Additionally, the USB wake functionality and the OTG functionality may include a $V_{BUS}$ detection block and an ID detection block that may provide $V_{BUS}$ and ID pin value changes to indicate the attachment or detachment of a USB cable. Further, the $V_{BUS}$ and ID pin value changes may indicate whether a USB cable is either attached or detached to a system, wherein the pin value changes may be sent to the SOC as a virtual interruption. The SOC may include system firmware to receive the virtual interruption. Additionally, the virtual interruptions may be sent to SOC firmware via an interface. Further, the system firmware of the SOC may be routinely refreshed to determine virtual interruptions. A copy of the local registers may be maintained on the SOC and the copy of the local registers may be connected to a USB controller located on the SOC. A power-ON message may be sent to the SOC firmware to invoke a USB device driver, wherein the SOC firmware and the USB driver may enable power-gating to the USB physical subsystem. Additionally, gated power-rails may be configured to electrically connect to the USB physical subsystem, wherein the gated power-rails may completely or partially shut-down power to the USB physical subsystem to place the USB physical subsystem in a standby mode. Further, a USB 2.0 Transceiver Macrocell Interface (UTMI+) bus protocol may be preserved.

Example 6

A system to minimize power leakage is described herein. The system includes a system-on-chip (SOC), where the SOC includes a physical subsystem, wherein the physical subsystem is to receive a power event. The system includes a power management logic including logic to perform a wake function and logic to perform an On-the-Go (OTG) function. The logic to perform the wake function includes wake capabilities to awake the system from a sleep state and the logic to perform the OTG function includes host and peripheral capabilities to support portable systems.

The physical subsystem may be completely power-gated. The system may include gated power-rails that may completely or partially shut-down power to the physical subsystem to place the physical subsystem in a standby mode. The wake function and OTG function may be located on the power management logic, and a bus protocol may be preserved. Additionally, the wake function and the OTG function may include a $V_{BUS}$ detection block, an ID detection block, logic related to $V_{BUS}$ and ID pins, wake timers, and a digital finite-state machine (FSM). Further, the power management logic may include local registers to record $V_{BUS}$ and ID pin value changes that signal whether a cable is either attached or detached to the system. The pin value changes may be sent to the SOC as a virtual interruption via interfaces. Further, the local registers on the power management logic may provide bus signals to preserve the bus protocol. The interfaces may include System V Interface Definition (SVID) virtual interrupt, an 12C data path, or any type of interface utilized to provide a physical connection to transfer data between the SOC and the power management logic. Additionally, the SOC may include system firmware to receive the virtual interruption. The virtual interruption may be sent to a processor located on the SOC and the virtual interruption may awake the physical subsystem from a stand-by mode by providing electrical connectivity via gated power-rails to the physical subsystem. The system firmware may include a handshake protocol that may communicate and respond to related events between the power management apparatus and the system firmware. Additionally, the SOC may maintain a copy of the local registers and the local registers may be connected to a controller. Further, an interface may be used to connect the physical subsystem with the controller. All bump pads or ball pads associated with the wake function and USB On-the-Go function may be removed from the SOC.

While the present disclosure has been described with respect to a limited number of embodiments, those skilled in the art will appreciate numerous modifications and variations therefrom. It is intended that the appended claims cover all such modifications and variations as fall within the true spirit and scope of this present disclosure.

In the preceding description, various aspects of the disclosed subject matter have been described. For purposes of explanation, specific numbers, systems and configurations were set forth in order to provide a thorough understanding of the subject matter. However, it is apparent to one skilled in the art having the benefit of this disclosure that the subject matter can be practiced without the specific details. In other instances, well-known features, components, or modules were omitted, simplified, combined, or split in order not to obscure the disclosed subject matter.

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope of the disclosed subject matter.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer)

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. A system to minimize power leakage, comprising:
   a system-on-chip (SOC), wherein the SOC includes a Universal Serial Bus (USB) physical subsystem, wherein the USB physical subsystem is to receive USB related events;
   a power management logic including USB wake functionality and USB On-the-Go (OTG) functionality; and
   a power management apparatus comprising local registers to the power management apparatus to record the $V_{BUS}$ and ID pin value changes, wherein the local registers trigger virtual interruptions, wherein the virtual interruptions include sensing the attachment or detachment of a USB cable.

2. The system of claim 1, wherein the USB physical subsystem is completely power-gated.

3. The system of claim 1, comprising gated power-rails electrically connected to the USB physical subsystem, wherein the gated power-rails can completely or partially shut-down power to the USB physical subsystem to place the USB physical subsystem in a standby mode.

4. The system of claim 1, wherein the USB wake functionality and USB OTG functionality are relocated to the power management logic from the SOC, and a USB 2.0 Transceiver Macrocell Interface (UTMI+) bus protocol is preserved.

5. The system of claim 1, wherein the USB wake functionality and the OTG functionality include a $V_{BUS}$ detection block and an ID detection block.

6. The system of claim 1, wherein the USB wake functionality and OTG functionality includes logic related to $V_{BUS}$ and ID pins, wake timers, and a digital finite-state machine (FSM).

7. The system of claim 1, wherein the pin value changes are sent to the SOC as a virtual interruption via interfaces.

8. The system of claim 7, wherein the local registers on the power management logic provide bus signals to preserve the UTMI+ bus protocol.

9. The system of claim 7, wherein the interfaces include a System V Interface Definition (SVID) virtual interrupt, an I²C data path, or any type of interface utilized to provide a physical connection to transfer data between the SOC and the power management logic.

10. The system of claim 7, wherein the SOC includes system firmware to receive the virtual interruption, wherein the virtual interruption is sent to a processor located on the SOC, wherein the virtual interruption awakes the USB physical subsystem from a stand-by mode by providing electrical connectivity via gated power-rails to the USB physical subsystem.

11. The system of claim 1, wherein the system firmware includes a handshake protocol to communicate and respond to USB related events between the power management logic and the system firmware.

12. The system of claim 7, wherein the SOC maintains a copy of the local registers, wherein the local registers are connected to a USB controller.

13. The system of claim 1, wherein a USB interface is used to connect the USB physical subsystem with a USB controller.

14. The system of claim 1, wherein all bump pads or ball pads associated with the USB wake functionality and USB On-the-Go functionality are removed from the SOC.

15. A method of minimizing power leakage, comprising:
placing logic for Universal Serial Bus (USB) wake functionality and On-the-Go (OTG) functionality on a power management apparatus;
connecting power-rails from the power management apparatus to a USB physical subsystem located on a system-on-chip (SOC) to enable complete or partial shut-down of power to the USB physical subsystem during a stand-by mode;
enabling SOC firmware to provide information between the power management apparatus and the SOC; and
adding local registers to the power management apparatus to record the $V_{BUS}$ and ID pin value changes, wherein the local registers trigger virtual interrupts, wherein the virtual interrupts include sensing the attachment or detachment of a USB cable.

16. The method of claim 15, comprising grouping together analog blocks related to $V_{BUS}$ logic, ID logic, and any detection circuit blocks and logic associated with detection circuit blocks that maintain a power-ON position, and placing the grouping on the power management apparatus.

17. The method of claim 15, wherein the USB wake functionality and the OTG functionality include a $V_{BUS}$ detection block and an ID detection block that provide $V_{BUS}$ and ID pin value changes to indicate attachment or detachment of a USB cable.

18. The method of claim 15, wherein the OTG functionality includes analog comparators, current/voltage basis generators, and clock timers.

19. The method of claim 15, comprising sending the virtual interrupts to SOC firmware via an interface.

20. The method of claim 15, comprising refreshing the system firmware of the SOC to routinely determine virtual interrupts.

21. The method of claim 15, comprising maintaining a copy of the local registers on the SOC.

22. The method of claim 21, comprising connecting the copy of the local registers to a USB controller located on the SOC.

23. The method of claim 15, comprising sending a power-ON message to a processor located in the SOC firmware to invoke a USB device driver, wherein the SOC firmware and the USB driver are utilized to enable power-gating to the USB physical subsystem.

24. A power management apparatus, comprising
a power supply block, wherein the power supply block is to be connected via power rails to a USB physical subsystem that is to be located on a system-on-chip (SOC);
a $V_{BUS}$ detection block;
an ID detection block; and
a $V_{BUS}$ and ID state register, wherein the $V_{BUS}$ and ID state register are to record the $V_{BUS}$ and ID pin value changes and trigger virtual interruptions, wherein the virtual interruptions include sensing the attachment or detachment of a USB cable.

25. The power management apparatus of claim 24, wherein the power management apparatus remains in a power-ON state independent of the USB physical subsystem.

26. The power management apparatus of claim 24, wherein the $V_{BUS}$ detection block and the ID detection block are analog blocks that remain in a power-ON state.

27. The power management apparatus of claim 24, wherein the $V_{BUS}$ and ID state register is utilized to record $V_{BUS}$ and ID pin value changes during attachment or detaching of a Universal Serial Bus (USB) cable.

28. The power management apparatus of claim 27, wherein the $V_{BUS}$ and ID state register is utilized to send the $V_{BUS}$ and ID pin value changes to the USB physical subsystem as virtual interruptions via an interface.

29. The power management apparatus of claim 24, wherein a wake function of the USB physical subsystem is supported by the power management apparatus to change the status of the USB physical subsystem from a stand-by mode to wake mode.

30. A system to minimize power leakage, comprising
a system-on-chip (SOC), wherein the SOC includes a physical subsystem, wherein the physical subsystem is to receive a power event;
a power management logic including logic to perform a wake function and logic to perform an On-the-Go (OTG) function, wherein the logic to perform the wake function includes wake capabilities to awake the system from a sleep state, and wherein the logic to perform the OTG function includes host and peripheral capabilities to support portable systems; and
a power management apparatus comprising local registers to record the $V_{BUS}$ and ID pin value changes, wherein the local registers trigger virtual interrupts, wherein the virtual interrupts include sensing the attachment or detachment of a USB cable.

31. The system of claim 30, wherein the physical subsystem is completely power-gated.

* * * * *